US011404842B2

(12) United States Patent
Sakamoto

(10) Patent No.: US 11,404,842 B2
(45) Date of Patent: Aug. 2, 2022

(54) LASER DEVICE, AND METHOD FOR ESTIMATING DEGREE OF DETERIORATION OF LIGHT SOURCE OF LASER DEVICE

(71) Applicant: Fujikura Ltd., Tokyo (JP)

(72) Inventor: Shinichi Sakamoto, Chiba (JP)

(73) Assignee: FUJIKURA LTD., Tokyo (JP)

( * ) Notice: Subject to any disclaimer, the term of this patent is extended or adjusted under 35 U.S.C. 154(b) by 373 days.

(21) Appl. No.: 16/632,031

(22) PCT Filed: Jun. 27, 2018

(86) PCT No.: PCT/JP2018/024366
§ 371 (c)(1),
(2) Date: Jan. 17, 2020

(87) PCT Pub. No.: WO2019/017171
PCT Pub. Date: Jan. 24, 2019

(65) Prior Publication Data
US 2020/0153196 A1     May 14, 2020

(30) Foreign Application Priority Data

Jul. 19, 2017   (JP) ............................. JP2017-140386

(51) Int. Cl.
*H01S 5/00*       (2006.01)
*H01S 3/067*      (2006.01)
(Continued)

(52) U.S. Cl.
CPC ........ *H01S 5/0021* (2013.01); *H01S 3/06754* (2013.01); *H01S 3/0912* (2013.01); *H01S 3/0941* (2013.01); *H01S 3/094003* (2013.01)

(58) Field of Classification Search
None
See application file for complete search history.

(56) References Cited

U.S. PATENT DOCUMENTS 5,374,973 A  * 12/1994  Maxham ............. H01S 3/06754
                                                     359/341.4
2003/0185260 A1  10/2003  Seo
(Continued)

FOREIGN PATENT DOCUMENTS

CN           1361932 A      7/2002
CN         101783476 A      7/2010
(Continued)

OTHER PUBLICATIONS

International Search Report issued in International Application No. PCT/JP2018/024366, dated Sep. 18, 2018 (3 pages).
(Continued)

*Primary Examiner* — Eric L Bolda
(74) *Attorney, Agent, or Firm* — Osha Bergman Watanabe & Burton LLP

(57) ABSTRACT

A laser device includes: a light source including laser diodes; a processor that holds: a maximum current value of a driving current applied to the laser diodes, and a maximum power value of a power of light emitted from the light source; and a memory, coupled to the processor, that stores a relationship between a magnitude of the driving current, a magnitude of the power of the light, and a degree of deterioration of the light source. The processor further refers to the memory and estimates the degree of deterioration from the maximum current value and the maximum power value.

9 Claims, 7 Drawing Sheets

(51) Int. Cl.
*H01S 3/091* (2006.01)
*H01S 3/094* (2006.01)
*H01S 3/0941* (2006.01)

(56) References Cited

U.S. PATENT DOCUMENTS

| | | | |
|---|---|---|---|
| 2004/0057663 | A1 | 3/2004 | Sato et al. |
| 2008/0285016 | A1* | 11/2008 | Eiselt ................ H04B 10/2942 356/73.1 |
| 2009/0254287 | A1 | 10/2009 | Ohgoh |
| 2019/0089110 | A1* | 3/2019 | Movassaghi ........ H01S 3/10069 |

FOREIGN PATENT DOCUMENTS

| | | |
|---|---|---|
| CN | 101911406 A | 12/2010 |
| CN | 102386553 A | 3/2012 |
| CN | 102823085 A | 12/2012 |
| CN | 104482477 A | 4/2015 |
| CN | 104713704 A | 6/2015 |
| CN | 105514774 A | 4/2016 |
| CN | 106405350 A | 2/2017 |
| EP | 0441709 A2 | 8/1991 |
| JP | 2005327438 A | 11/2005 |
| JP | 2006-222411 A | 8/2006 |
| JP | 2009-252960 A | 10/2009 |
| JP | 4532249 B2 | 8/2010 |
| JP | 2011-171690 A | 9/2011 |
| WO | 2014/156227 A1 | 10/2014 |

OTHER PUBLICATIONS

Extended European Search Report issued in corresponding European Patent Application No. 18836099.4 dated Mar. 30, 2021 (6 pages).

* cited by examiner

LASER DEVICE, AND METHOD FOR ESTIMATING DEGREE OF DETERIORATION OF LIGHT SOURCE OF LASER DEVICE

TECHNICAL FIELD

The present invention relates to a laser device capable of appropriately detecting a state of deterioration of a light source using laser diodes and a method for estimating the degree of deterioration of a light source of a laser device.

BACKGROUND

Because fiber laser devices can obtain light with excellent light-condensing properties, high power density, and a small beam spot, fiber laser devices are being used in a variety of fields such as the laser processing field and the medical field. Consequently, fiber laser devices are sometimes used in combination with a processing machine.

In a fiber laser device, a plurality of laser diodes (LDs) are typically used as a source of pumping light. In some cases, laser diodes may malfunction or exhibit weakened output for various reasons. If one or some of the laser diodes in a fiber laser device malfunction or exhibit reduced output, the pumping light source may still continue to be used in some cases through means such as increasing the power of the light emitted from the other laser diodes. However, in some cases the power of the light from the pumping light source falls by a certain ratio or greater, in other cases the pumping light source must be replaced, and in still other cases the fiber laser device itself reaches a use limit and must be replaced. Consequently, there is demand for a way to estimate the degree of deterioration of a pumping light source.

Patent Literature 1 below describes an optical amplifier capable of determining the degree of deterioration of a pumping light source. In the optical amplifier, the relationship between the driving current of a pumping light source element, such as a laser diode, and the power of the emitted pumping light in an initial state is compared to the relationship between the driving current of the pumping light source element and the power of the emitted pumping light in a state after a certain duration of use. From the comparison result, the degree of deterioration of the pumping light source element is determined.

[Patent Literature 1] Japanese Patent No. 4532249

SUMMARY

In Patent Literature 1, the relationship between the driving current of a pumping light source element, such as a laser diode, and the power of the emitted pumping light is used to determine the degree of deterioration of each pumping light source element. However, the timing when the driving current applied to a laser diode and the timing when light is emitted from the laser diode may not match each other in some cases. Consequently, at the timing when a large driving current is applied to a laser diode, it is not necessarily always the case that high-power light will be emitted from the pumping light source, and sometimes high-power light may be emitted from the pumping light source at a timing when a small driving current is applied to the laser diode, or low-power light may be emitted from the pumping light source at a timing when a large driving current is applied to the laser diode. Consequently, simply comparing the relationship between the magnitude of the driving current input into a laser diode to the power of light emitted from the pumping light source may result in a determination that the pumping light source is deteriorated or that the pumping light source is not deteriorated much, depending on the timing when the degree of deterioration is determined. In this way, the estimation of the degree of deterioration of the pumping light source becomes inconsistent, and there are concerns about being unable to appropriately estimate the degree of deterioration. Such concerns may also extend to laser devices other than fiber lasers, insofar as the laser device uses a laser diode.

One or more embodiments of the present invention provide a laser device capable of appropriately estimating a state of deterioration of a light source using laser diodes and a method for estimating the degree of deterioration of a light source of a laser device.

To solve the issues described above, the present invention provides a laser device including: a light source including a plurality of laser diodes; a driving current peak hold unit that holds a maximum value within a predetermined period of a driving current applied to the plurality of laser diodes; an optical power peak hold unit that holds a maximum value within the predetermined period of a power of light emitted from the light source; memory that stores a relationship between a magnitude of the driving current, a magnitude of the power of the light, and a degree of deterioration of the light source; and a degree-of-deterioration estimation unit that refers to the memory to estimate the degree of deterioration from the maximum value within the predetermined period of the driving current held in the driving current peak hold unit and the maximum value within the predetermined period of the power of the light held in the optical power peak hold unit.

As described above, the timing when the driving current applied to a laser diode and the timing when light is emitted from the laser diode may not match each other in some cases. Consequently, in some cases, the timing when the magnitude of the driving current applied to a laser diode reaches a maximum may not match the timing when the power of the light emitted from a light source including a plurality of laser diodes reaches a maximum. In other words, in some cases, the maximum driving current is applied to a laser diode, and after predetermined amount of time elapses, light of maximum power according to the maximum driving current is emitted. For this reason, even in cases where the timing when the magnitude of the driving current reaches a maximum does not match the timing when the power of the light reaches a maximum, the maximum value of the magnitude of the driving current and the maximum value of the power of the light emitted from the light source correspond with each other for the most part. Consequently, by estimating the degree of deterioration of the light source from the maximum value of the driving current and the maximum value of the power of the light within a predetermined period like in the present invention, the state of deterioration of the light source can be estimated appropriately. Note that the maximum value of the driving current and the maximum value of the power of the light do not include phenomena such as a large current that flows momentarily because of spike noise or the like, or light having a high peak value that is emitted momentarily because of unintentional oscillations or the like.

Further, the memory additionally stores a relationship between the degree of deterioration and a time until the light source reaches a predetermined use limit, the laser device may further include: a use-limit time estimation unit that refers to the memory to additionally estimate the time until the light source reaches the use limit from the estimated degree of deterioration.

Even when the state of deterioration of the light source is estimated appropriately, it is still difficult for a user to grasp the amount of time left until the use limit of the laser device is reached on the basis of the estimated degree of deterioration. However, as above, by estimating the time until a predetermined use limit is reached from the degree of deterioration of the light source, the user of the laser device can easily grasp the amount of time left until the light source reaches the use limit, and make appropriate preparations, such as readying a spare light source, in a timely manner.

Further, the laser device may further include: a controller; a driving power source unit that applies a current to the plurality of laser diodes; and an optical power monitor that monitors the power of the light emitted from the light source, in which in a case where a signal indicating a drop in the power of the light is input from the optical power monitor, the controller controls the driving power source unit to increase the driving current in a range in which the power of the light emitted from the light source does not exceed the power of the light before the signal indicating the drop in the power of the light was input from the optical power monitor.

In this case, even if several of the plurality of laser diodes in the light source become deteriorated and the power of the light emitted from the light source drops, by controlling the driving power source unit to increase the driving current, an insufficiency in the power of the light emitted from the laser device can be suppressed. Also, by increasing the driving current, the maximum value of the driving current held in the driving current peak hold unit is updated. On the other hand, the maximum value of the power of the light held in the optical power peak hold unit remains the same value from before the signal indicating a drop in the power of the light was input from the optical power monitor. In the case where the light source has deteriorated, the driving current increases even if the power of the emitted light is constant. Consequently, according to the laser device, the state of deterioration of the light source can be estimated more appropriately.

Further, the laser device may further include: a controller; a driving power source unit that applies a current to the plurality of laser diodes; and an optical power monitor that monitors the power of the light emitted from the light source, in which in a case where a signal indicating a drop in the power of the light is input from the optical power monitor, the controller controls the driving power source unit to make the power of the light emitted from the light source equal to the power of the light before the signal indicating the drop in the power of the light was input from the optical power monitor.

Through such control, an insufficiency in the power of the light emitted from the laser device can be suppressed further. Also, by increasing the driving current such that the power of the emitted light becomes the same as the power before the signal indicating a drop in the power of the light was input, the maximum value of the driving current held in the driving current peak hold unit is updated. Consequently, the state of deterioration of the light source can be estimated appropriately.

Further, the driving current peak hold unit may erase the maximum value of the driving current stored within the predetermined period after the predetermined period elapses, and the optical power peak hold unit erases the maximum value of the power of the light stored within the predetermined period after the predetermined period elapses.

By erasing the maximum value of the driving current and the maximum value of the power of the light after a predetermined period elapses in this way, the capacity of the temporary storage unit inside the driving current peak hold unit and the optical power peak hold unit can be reduced. Also, even in cases where the user switches to low-output operation for long-term use, a memory-full state can be suppressed and the present degree of laser diode deterioration can be diagnosed.

Further, the light source may additionally include amplification optical fiber doped with an active element that is pumped by light emitted from the plurality of laser diodes.

In this case, the light source is formed from a fiber laser device, and the plurality of laser diodes acts as the pumping light source unit that emits pumping light. With such a light source, the light emitted from the plurality of laser diodes pumps the active element, and light emitted from the pumped active element is emitted from the amplification optical fiber. In this case, compared to the case where the light emitted from the laser diodes is emitted directly from the light source, the timing when the current is applied to the laser diodes and the timing when the light is emitted from the light source tend to separate further. However, according to the laser device according to the present invention in which the degree of deterioration of the light source is estimated from the maximum value of the driving current and the maximum value of the power of the light, even in cases that include amplification optical fiber as above, the state of deterioration of the light source can be estimated appropriately.

Further, the laser device may further include amplification optical fiber doped with an active element that is pumped by light emitted from the light source, in which the driving current peak hold unit holds the maximum value of the power of the light before the light enters the amplification optical fiber.

In this case, because the light emitted from the light source pumps the active element of the amplification optical fiber, the light source can be understood to be a pumping light source, and a fiber laser device is formed as the overall laser device. Even in such a case, the state of deterioration of the light source can be estimated appropriately. Also, in this case, by combining the above with another monitor, it becomes possible to better estimate the malfunctioning location in the overall fiber laser.

Further, to solve the issue described above, the present invention provides a method for estimating a degree of deterioration of a light source of a laser device, in which the light source includes a plurality of laser diodes, the method including: a driving current peak holding step of holding a maximum value within a predetermined period of a driving current applied to the plurality of laser diodes; an optical power peak holding step of holding a maximum value within the predetermined period of a power of light emitted from the light source; and a degree-of-deterioration estimating step of referring to a memory that stores a relationship between a magnitude of the driving current, a magnitude of the power of the light, and the degree of deterioration of the light source, and estimating the degree of deterioration from the maximum value within the predetermined period of the driving current held in the driving current peak holding step and the maximum value within the predetermined period of the power of the light held in the optical power peak holding step.

According to such a method for estimating the degree of deterioration of a light source of a laser device, by estimating the degree of deterioration of the light source from the maximum value of the driving current and the maximum value of the power of the light within a predetermined period, the state of deterioration of the light source can be estimated appropriately.

The memory may additionally store a relationship between the degree of deterioration and the amount of time until the light source reaches a predetermined use limit, and the method for estimating the degree of deterioration of a light source of a laser device additionally includes a use-limit time estimating step that additionally estimates the amount of time until the light source reaches the use limit from the estimated degree of deterioration.

According to such a method for estimating the degree of deterioration of a light source of a laser device, a user of the laser device can easily grasp the amount of time left until the light source reaches the use limit, and make appropriate preparations, such as readying a spare light source, in a timely manner.

As described above, according to the present invention, a laser device capable of appropriately estimating a state of deterioration of a light source using laser diodes and a method for estimating the degree of deterioration of a light source of a laser device are provided.

DETAILED DESCRIPTION

Hereinafter, one or more embodiments of the laser device and the method for estimating the degree of deterioration of a light source of a laser device according to the present invention will be described in detail with reference to the drawings.

Figure 1:
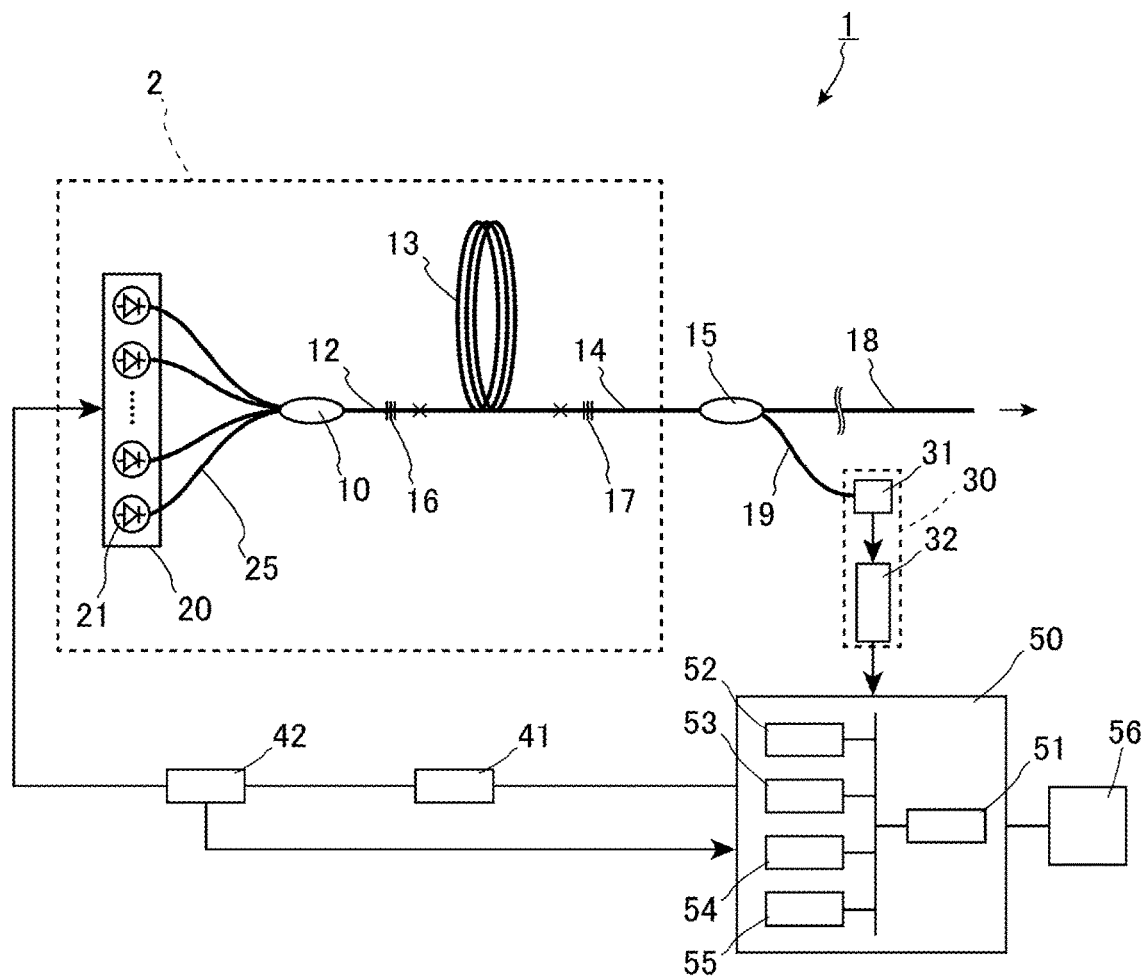
FIG. 1 is a diagram illustrating a laser device according to one or more embodiments of the present invention.

FIG. 1 is a diagram illustrating a laser device according to one or more embodiments. As illustrated in FIG. 1, the laser device 1 according to one or more embodiments is provided with a light source 2, an optical power monitor 30, a driving power source unit 41, a driving current monitor 42, a processor 50, and a memory 56 as a major configuration.

The light source 2 is provided with a pumping light source unit 20 that emits pumping light, amplification optical fiber 13 doped with an active element that is pumped by the pumping light emitted from the pumping light source unit 20, optical fiber 12 connected to one end of the amplification optical fiber 13, a high-reflectivity FBG 16 provided in the optical fiber 12, a combiner 10 for entering pumping light into the optical fiber 12, optical fiber 14 connected to the other end of the amplification optical fiber 13, and a low-reflectivity FBG 17 provided in the optical fiber 14 as a major configuration. The amplification optical fiber 13, the high-reflectivity FBG 16, and the low-reflectivity FBG 17 together form a resonator, and the light source 2 can be understood as including a fiber laser device.

The pumping light source unit 20 includes a plurality of laser diodes 21, and emits pumping light of a wavelength that pumps the active element used to dope the amplification optical fiber 13. Each laser diode 21 of the pumping light source unit 20 is connected to pumping optical fiber 25, and light emitted from each laser diode 21 is propagated through the pumping optical fiber 25 optically connected to each laser diode 21. The pumping optical fiber 25 may be multi-mode fiber, for example, and in this case, the pumping light is propagated through the pumping optical fiber 25 as multi-mode light. Note that in the case where the active element used to dope the amplification optical fiber 13 is ytterbium as described later, the wavelength of the pumping light is set to 915 nm, for example.

The amplification optical fiber 13 includes a core, an inner cladding that gaplessly surrounds the outer circumferential surface of the core, an outer cladding that covers the outer circumferential surface of the inner cladding, and a covering layer that covers the outer circumferential surface of the outer cladding. The material used to form the core of the amplification optical fiber 13 may be, for example, quartz doped with an element such as germanium that raises the refractive index and an active element such as ytterbium (Yb) that is pumped by the light emitted from the pumping light source unit 20. Such an active element may be one of the rare-earth elements. Besides ytterbium mentioned above, the rare-earth elements include elements such as thulium (Tm), cerium (Ce), neodymium (Nd), europium (Eu), and erbium (Er). Furthermore, besides the rare-earth elements, an element such as bismuth (Bi) may also be used as the active element. Also, the material used to form the inner cladding of the amplification optical fiber 13 may be, for example, pure quartz not doped with any dopant. Note that in the case where the core is not doped with an element that raises the refractive index, the cladding is quartz doped with an element that lowers the refractive index, such as fluorine for example. Also, the material used to form the outer cladding of the amplification optical fiber 13 may be a resin having a lower refractive index than the inner cladding, for example, and the material used to form the covering layer of the amplification optical fiber 13 may be a UV-cured resin different from the resin used to form the outer cladding. The amplification optical fiber 13 is taken to be a single-mode fiber that propagates light mainly in a basic mode, but to enable the core of the amplification optical fiber to propagate high-power signal light, the diameter of the core may be made similar to the core of multi-mode fiber while still propagating light mainly in a basic mode. Alternatively, the amplification optical fiber 13 may be taken to be few-mode fiber that propagates light in a few modes while maintaining the beam quality of the light propagating through the core, or in cases where the beam quality is not a concern, the amplification optical fiber 13 may be taken to be multi-mode fiber.

The optical fiber 12 has the same configuration as the amplification optical fiber 13, except that the core is not doped with an active element. The optical fiber 12 is connected to one end of the amplification optical fiber 13, with the central axis of the core aligned with the central axis of the core of the amplification optical fiber 13. Consequently, the core of the amplification optical fiber 13 and the core of the optical fiber 12 are optically coupled, and the inner cladding of the amplification optical fiber 13 and the inner cladding of the optical fiber 12 are optically coupled.

Also, the high-reflectivity FBG 16 is provided in the core of the optical fiber 12. With this arrangement, the high-reflectivity FBG 16 is provided on one side of the amplification optical fiber 13. In the high-reflectivity FBG 16, a portion of higher refractive index is repeated on a fixed period along the lengthwise direction of the optical fiber 12. By adjusting the period, the high-reflectivity FBG 16 reflects light of a specific wavelength from among the light emitted by the active element of the amplification optical fiber 13 in the pumped state. In the case where the active element used to dope the amplification optical fiber 13 is ytterbium as described above, the high-reflectivity FBG 16 reflects light having a wavelength of 1060 nm for example with a reflectivity of 99% or greater, for example.

Also, in the combiner 10, the cores of the pumping optical fibers 25 are connected to the inner cladding of the optical fiber 12. With this arrangement, the pumping optical fibers 25 connected to the pumping light source unit 20 are optically coupled with the inner cladding of the amplification optical fiber 13 via the inner cladding of the optical fiber 12.

The optical fiber 14 includes a core similar to the core of the amplification optical fiber 13 except that the core is not doped with an active element, a cladding of similar configuration to the inner cladding of the amplification optical fiber 13 that gaplessly surrounds the outer circumferential surface of the core, and a covering layer that covers the outer circumferential surface of the cladding. The optical fiber 14 is connected to the other end of the amplification optical fiber 13, and the core of the amplification optical fiber 13 and the core of the optical fiber 14 are optically coupled.

Also, the low-reflectivity FBG 17 is provided in the core of the optical fiber 14. With this arrangement, the low-reflectivity FBG 17 is provided on the other side of the amplification optical fiber 13. In the low-reflectivity FBG 17, a portion of higher refractive index is repeated on a fixed period along the lengthwise direction of the optical fiber 14, such that light of at least a portion of the wavelength(s) of the light reflected by the high-reflectivity FBG 16 is reflected at a lower reflectivity than the high-reflectivity FBG 16. For example, the low-reflectivity FBG 17 is configured to reflect light of the same wavelength as the light reflected by the high-reflectivity FBG 16, at a reflectivity of 50%. Consequently, in the case where the high-reflectivity FBG 16 reflects light having a wavelength of 1060 nm as above, the low-reflectivity FBG 17 transmits a portion of the light having that wavelength, and the transmitted light is emitted from the optical fiber 14.

Consequently, in one or more embodiments, the optical fiber 14 up to at least the portion containing the low-reflectivity FBG 17 is considered part of the light source 2.

Also, on the side of the optical fiber 14 opposite from the amplification optical fiber 13, a coupler 15 is provided. In the coupler 15, optical fiber 18 acting as delivery fiber and optical fiber 19 acting as monitor fiber are connected to the optical fiber 14. Note that the optical fiber 14 and the optical fiber 18 may also be a single unitary optical fiber. The majority of the light propagated through the optical fiber 14 is propagated to the optical fiber 18 in the coupler 15, while a fixed ratio of the light propagated through the optical fiber 14 is split at the coupler 15 and directed into the optical fiber 19.

The optical power monitor 30 is connected to the optical fiber 19. The optical power monitor 30 includes a photodetector 31 and an A/D converter 32. The photodetector 31 includes a photodiode or the like, and outputs a voltage corresponding to the power of the light emitted from the optical fiber 19. Also, the A/D converter 32 is electrically connected to the photodetector 31, and outputs a signal based on the input voltage. Consequently, a signal based on the power of the light propagated through the optical fiber 19 is output from the optical power monitor 30. Because the light propagated through the optical fiber 19 is a fixed ratio of the light propagated through the optical fiber 14 as described above, a signal based on the power of the light propagated through the optical fiber 14 is output from the optical power monitor 30. For this reason, the optical power monitor 30 can be understood as a component that monitors the power of the light emitted from the light source 2. Note that the optical power monitor 30 is not limited to the above configuration insofar as the optical power monitor 30 monitors the power of the light emitted from the light source 2.

Note that in one or more embodiments, a portion of the light propagated through the optical fiber 14 is split by the coupler 15, and the power of the light is monitored by the optical power monitor 30. However, the power of the light propagated through the optical fiber 14 may also be monitored with a Rayleigh monitor that monitors the Rayleigh light propagated through the optical fiber 14 without using the coupler 15.

The processor 50 is electrically connected to the optical power monitor 30. The driving power source unit 41 is electrically connected to the processor 50. The driving power source unit 41 applies a predetermined current to the plurality of laser diodes 21 in the pumping light source unit 20 of the light source 2, on the basis of a signal received from the processor 50.

Also, the driving current monitor 42 is electrically connected on the electrical path leading from the driving power source unit 41 to the pumping light source unit 20 of the light source 2. The driving current monitor 42 monitors the magnitude of the current that the driving power source unit 41 applies to the plurality of laser diodes 21. The driving current monitor 42 is electrically connected to the processor 50, and inputs into the processor 50 a signal based on the magnitude of the current that the driving power source unit 41 applies to the plurality of laser diodes 21.

The processor 50 includes a controller 51, a driving current peak hold unit 52, an optical power peak hold unit 53, a degree-of-deterioration estimation unit 54, and a use-limit time estimation unit 55. Also, the memory 56 is electrically connected to the processor 50.

The controller 51 controls the driving power source unit 41 and blocks other than the controller 51 inside the processor 50.

The driving current peak hold unit 52 includes internal memory and a comparator, for example, and holds a maximum value of the current value of the driving current input from the driving current monitor 42. Note that the internal memory may also be substituted by a portion of the memory 56. In one or more embodiments, the driving current peak hold unit 52 is reset on a predetermined period, and every time the predetermined period elapses, the held maximum value of the driving current is erased. Consequently, the driving current peak hold unit 52 holds the maximum value within the predetermined period of the driving current applied to the plurality of laser diodes 21. The driving current peak hold unit 52 may perform the erasure every predetermined period, or the controller 51 may control the driving current peak hold unit 52 to perform the erasure every predetermined period. Also, the predetermined period is not particularly limited, and is set from 1 hour to 24 hours, for example.

The optical power peak hold unit 53 includes internal memory and a comparator, for example, and holds a maximum value of the optical power input from the optical power monitor 30. Note that the internal memory may also be substituted by a portion of the memory 56. As above, because the optical power monitor 30 can be understood as a component that monitors the power of the light emitted from the light source 2, the optical power peak hold unit 53 that stores the maximum value of the optical power input from the optical power monitor 30 can be understood as holding the maximum value of the power of the light emitted from the light source 2. In one or more embodiments, the optical power peak hold unit 53 is reset on the above predetermined period that is reset by the driving current peak hold unit 52, and every time the predetermined period elapses, the held maximum value of the power of the light is erased. Consequently, the optical power peak hold unit 53 holds the maximum value within the predetermined period of the power of the light emitted from the light source 2. The optical power peak hold unit 53 may perform the erasure every predetermined period, or the controller 51 may control the optical power peak hold unit 53 to perform the erasure every predetermined period. Also, the predetermined period reset by the optical power peak hold unit 53 is taken to be the same as the predetermined period reset by the driving current peak hold unit 52.

The degree-of-deterioration estimation unit 54 refers to the memory 56 to estimate the degree of deterioration of the light source 2 from the maximum value of the driving current held in the driving current peak hold unit 52 and the maximum value of the power of the light held in the optical power peak hold unit 53.

Figure 2:
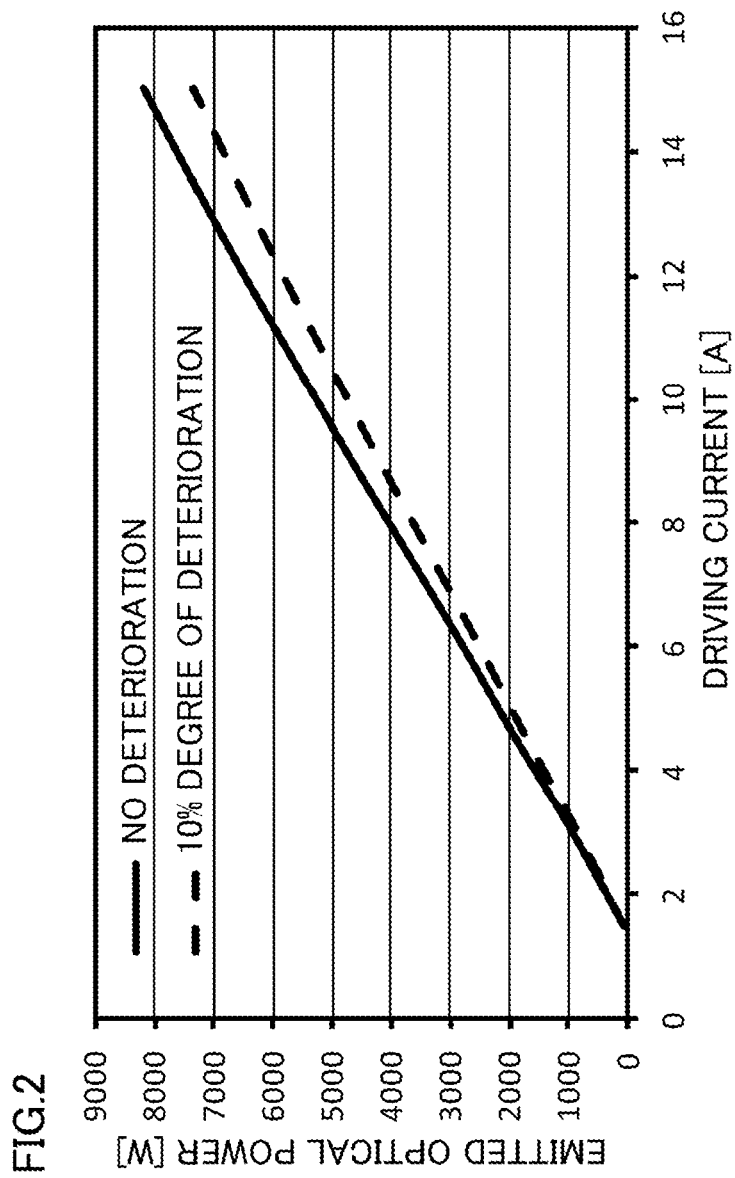
FIG. 2 is a graph that schematically illustrates a relationship, stored in memory, between the magnitude of the driving current, the magnitude of the power of the light, and the degree of deterioration of the light source.

Consequently, a relationship between the magnitude of the driving current, the magnitude of the power of the light, and the degree of deterioration of the light source is stored in the memory 56. FIG. 2 is a graph that schematically illustrates a relationship, stored in the memory 56, between the magnitude of the driving current, the magnitude of the power of the light, and the degree of deterioration of the light source 2. In FIG. 2 the horizontal axis represents the magnitude of the driving current applied to the plurality of laser diodes 21 of the pumping light source unit 20, while the vertical axis represents the power of the light emitted from the light source 2. In FIG. 2, the solid line indicates the magnitude of the driving current and the magnitude of the power of the light in a state in which the efficiency of the plurality of laser diodes 21 of the pumping light source unit 20 is not reduced, while the dashed line indicates the magnitude of the driving current and the magnitude of the power of the light in a state in which the plurality of laser diodes 21 of the pumping light source unit 20 have a 10% degree of deterioration. The degree of deterioration indicates the ratio of the drop in the power of the light emitted from the light source 2 in the case where the driving current that should be applied to the plurality of laser diodes 21 in the state in which each laser diode 21 is not deteriorated is applied to the plurality of laser diodes 21 in a deteriorated light source 2. Consequently, the degree of deterioration exists in a predetermined relationship with the reduction in the efficiency of the light source 2. For example, assuming that the pumping light source unit 20 of the light source 2 is provided with 10 laser diodes 21, in the case where the power of the light from one of the laser diodes 21 falls to 0% while the other laser diodes continue to emit light at 100% power without being deteriorated, the degree of deterioration of the light source 2 is 10%. In this case, the degree of deterioration is equal to the ratio of malfunctioning laser diodes 21 among the plurality of laser diodes 21, or in other words the malfunction ratio. As another example, given a state in which the initial driving current is being applied to the plurality of laser diodes 21 in the light source 2, in the case where the power of the light from each of the plurality of laser diodes 21 falls 10%, the degree of deterioration of the light source 2 is 10%. As FIG. 2 demonstrates, in the case of emitting light of fixed power from the light source 2, the driving current to be applied to the plurality of laser diodes 21 of the pumping light source unit 20 is greater when the light source 2 is in a deteriorated state compared to when the light source 2 is in a non-deteriorated state. Note that in FIG. 2, only the case of a 10% degree of deterioration is illustrated as an example of deterioration of the light source 2, but the memory 56 may store the relationship between the magnitude of the driving current and the magnitude of the power of the light for the cases of 0%, 5%, 10%, 15%, 20%, and 25% degree of deterioration of the light source 2, for example.

The degree-of-deterioration estimation unit 54 reads out the maximum value of the driving current held in the driving current peak hold unit 52 and the maximum value of the power of the light held in the optical power peak hold unit 53. Subsequently, a degree of deterioration stored in the memory 56 that is close to the relationship between the read-out maximum values of the driving current and the power of the light is determined. For example, in the case where the power of the light emitted from the light source 2 is 5 kW and the driving current is 9.5 A, from FIG. 2 the degree-of-deterioration estimation unit 54 estimates that all of the laser diodes 21 are operating without deterioration, and outputs a result indicating the same. As another example, in the case where the power of the light emitted from the light source 2 is 5 kW and the driving current is 10.5 A, from FIG. 2 the degree-of-deterioration estimation unit 54 estimates that the light source 2 has a 10% degree of deterioration, and outputs a result indicating the same.

Also, the use-limit time estimation unit 55 refers to the memory 56 to estimate the time until the light source 2 reaches a predetermined use limit from the degree of deterioration of the light source 2 estimated by the degree-of-deterioration estimation unit 54.

Figure 3:
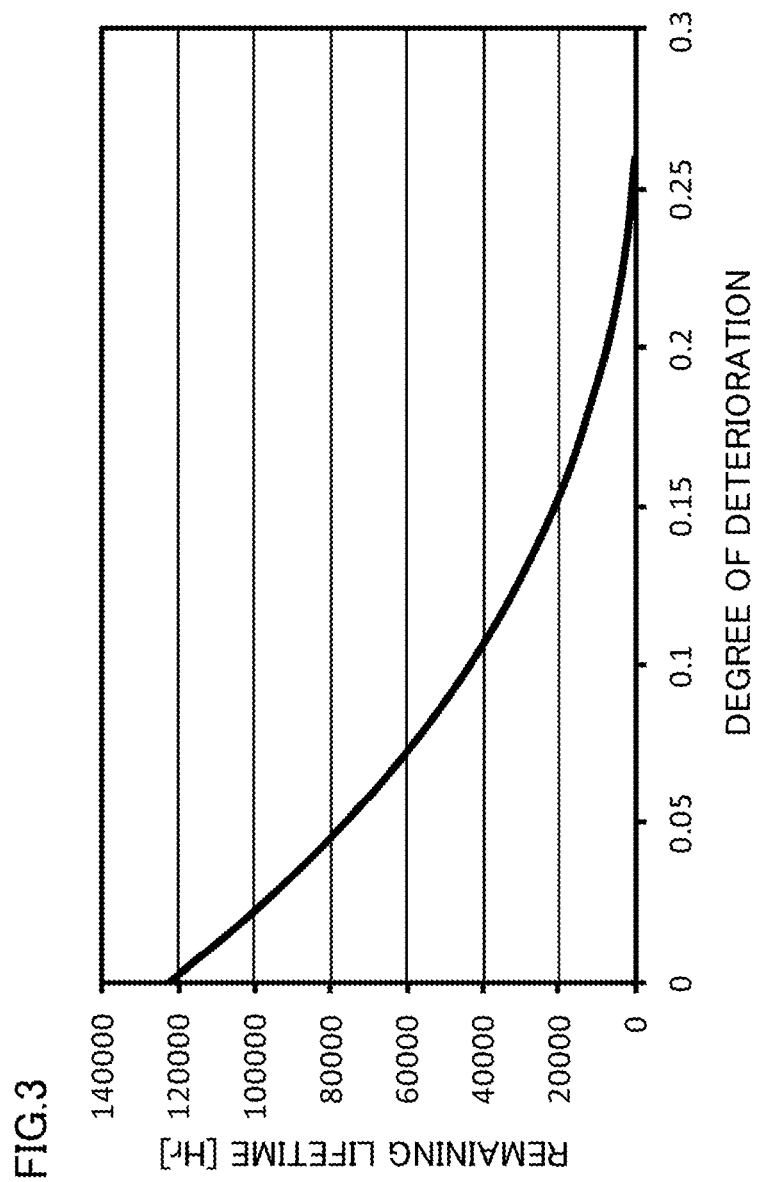
FIG. 3 is a graph that schematically illustrates a relationship, stored in memory, between the degree of deterioration and the time until the light source reaches a predetermined use limit.

Consequently, a relationship between the degree of deterioration of the light source 2 and the time until the light source 2 reaches a predetermined use limit is stored in the memory 56. FIG. 3 is a graph that schematically illustrates a relationship, stored in the memory 56, between the degree of deterioration and the time until the light source reaches a predetermined use limit. In FIG. 3, the horizontal axis represents the degree of deterioration of the light source 2, while the vertical axis represents the magnitude of the light emitted from the light source 2. As illustrated in FIG. 3, in one or more embodiments, the light source 2 reaches the use limit after 120,000 hours in the case where all of the laser diodes 21 operate without deteriorating, but in the case where the degree of deterioration of the light source 2 is 10%, the use limit is reached after 40,000 hours, and in the case where the degree of deterioration of the light source 2 is 15%, the use limit is reached after 20,000 hours. Furthermore, in the case where the degree of deterioration of the light source 2 is 25%, the light source 2 has reached the use limit.

The use-limit time estimation unit 55 reads the signal related to the degree of deterioration of the light source 2 output by the degree-of-deterioration estimation unit 54, and if the estimation result from the degree-of-deterioration estimation unit 54 indicates that the degree of deterioration of the light source 2 is 10%, the use-limit time estimation unit 55 estimates that the time until the use limit of the light source 2 is 40,000 hours, whereas if the estimation result from the degree-of-deterioration estimation unit 54 indicates that the degree of deterioration of the light source 2 is 25% or higher, the use-limit time estimation unit 55 outputs a result indicating that the light source 2 has reached the use limit.

Note that, although not particularly illustrated in the diagrams, the degree of deterioration of the light source 2 estimated by the degree-of-deterioration estimation unit 54 and the time until the use limit of the light source 2 estimated by the use-limit time estimation unit 55 may be output to an output unit such as a monitor for visualization.

Next, the operations of the laser device 1 will be described.

First, the controller 51 controls the driving power source unit 41 such that the driving power source unit 41 applies a predetermined driving current to each laser diode 21 of the pumping light source unit 20. Subsequently, pumping light is emitted from each laser diode 21. The pumping light emitted from the pumping light source unit 20 proceeds from the pumping optical fiber 25 through the inner cladding of the optical fiber 12 and enters the inner cladding of the amplification optical fiber 13. The pumping light entering the inner cladding of the amplification optical fiber 13 mainly propagates through the inner cladding, and when passing through the core of the amplification optical fiber 13, pumps the active element used to dope the core. The pumped active element emits light of a specific wavelength by spontaneous emission. This spontaneously emitted light propagates through the core of the amplification optical fiber 13, and the light of a portion of the wavelength(s) is reflected by the high-reflectivity FBG 16. Of the reflected light, light of the wavelength that the low-reflectivity FBG 17 reflects is reflected by the low-reflectivity FBG 17 and travels back-and-forth between the high-reflectivity FBG 16 and the low-reflectivity FBG 17, or in other words inside the resonator. This light is amplified by stimulated emission when propagating through the core of the amplification optical fiber 13, and enters a laser oscillation state. Additionally, a portion of the amplified light is transmitted through the low-reflectivity FBG 17 and emitted from the optical fiber 14. Almost all of the light emitted from the optical fiber 14 is propagated to the optical fiber 18 in the coupler 15, and is emitted from the optical fiber 18. With this arrangement, light is emitted from the laser device 1.

Next, a method for estimating the degree of deterioration of the light source 2 of the laser device 1 and a method for estimating the use-limit time of the light source 2 will be described.

Figure 4:
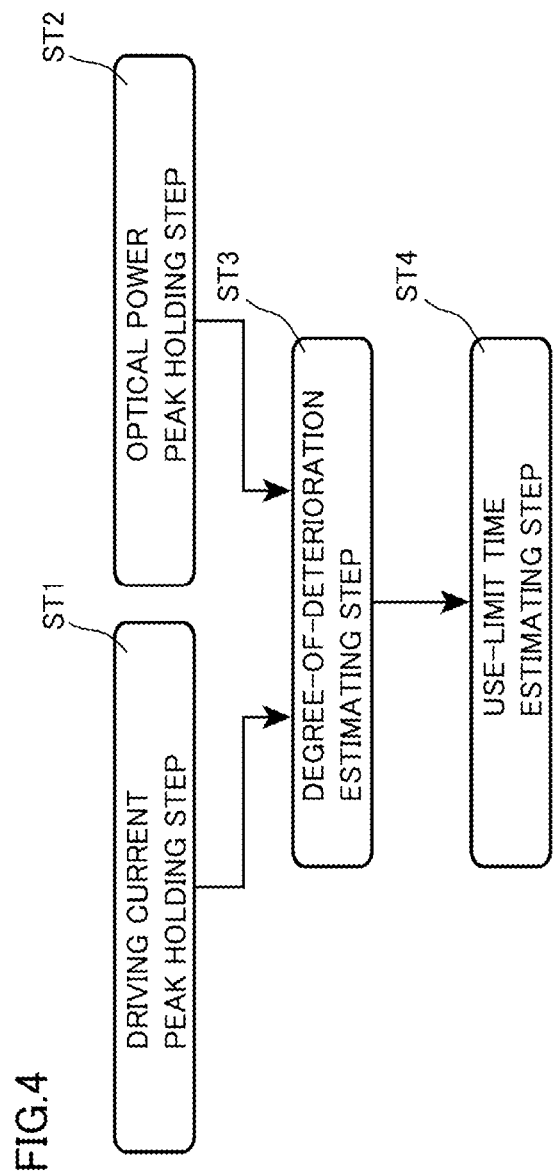
FIG. 4 is a flowchart illustrating operations by a processor.

FIG. 4 is a flowchart illustrating a method for estimating the degree of deterioration of the light source 2 and a method for estimating the use-limit time of the light source 2.

As above, when a predetermined driving current from the driving power source unit 41 is applied to each laser diode 21 of the pumping light source unit 20, the driving current monitor 42 detects the driving current and inputs a signal corresponding to the magnitude of the driving current into the processor 50. When the signal corresponding to the magnitude of the driving current is input into the processor 50, the controller 51 controls the driving current peak hold unit 52 in a driving current peak holding step ST1. The driving current peak hold unit 52 controlled by the controller 51 compares the maximum value of the driving current already held within the predetermined period by the driving current peak hold unit 52 to the magnitude of the driving current input from the driving current monitor 42. If the comparison result is that the magnitude of the driving current input from the driving current monitor 42 is greater than the maximum value of the driving current already held by the driving current peak hold unit 52, the driving current peak hold unit 52 newly holds the magnitude of the driving current input from the driving current monitor 42 as the maximum value of the driving current. On the other hand, if the comparison result is that the maximum value of the driving current already held by the driving current peak hold unit 52 is greater than the magnitude of the driving current input from the driving current monitor 42, the driving current peak hold unit 52 keeps holding the currently held maximum value of the driving current. Note that to eliminate phenomena such as spike noise, the driving current monitor 42 may include a low-pass filter and is configured not to detect peaks in the driving current with a duration of 10 μs or less, for example. Alternatively, in cases where the duration over which the driving current reaches a maximum value is a predetermined time such as 10 μs or less, for example, the driving current peak hold unit 52 may be controlled to treat such values as spike noise and not handle such values as a maximum value of the driving current.

Also, when light is emitted from the light source 2 as above, most of the light propagated through the optical fiber 14 is propagated to the delivery fiber, namely the optical fiber 18, in the coupler 15, but a fixed ratio of the light propagated through the optical fiber 14 is propagated to the optical fiber 19. The light propagated to the optical fiber 19 is received by the photodetector 31. The photodetector 31 outputs a voltage based on the power of the received light, and the voltage is input into the A/D converter 32. The A/D converter 32 outputs a signal based on the input voltage, and the signal is input into the processor 50. Consequently, a signal based on the power of the light propagated through the optical fiber 19 is output from the optical power monitor 30 that includes the A/D converter 32 as above. As described earlier, the signal is also a signal based on the power of the light propagated through the optical fiber 14. When a signal based on the power of the light propagated through the optical fiber 14 is input into the processor 50, the controller 51 controls the optical power peak hold unit 53 in an optical power peak holding step ST2. The optical power peak hold unit 53 controlled by the controller 51 compares the maximum value of the optical power already held within the predetermined period by the optical power peak hold unit 53 to the magnitude of the optical power input from the optical power monitor 30. If the comparison result is that the magnitude of the optical power input from the optical power monitor 30 is greater than the maximum value of the optical power already held by the optical power peak hold unit 53, the optical power peak hold unit 53 newly holds the magnitude of the optical power input from the optical power monitor 30 as the maximum value of the optical power. On the other hand, if the comparison result is that the maximum value of the optical power already held by the optical power peak hold unit 53 is greater than the magnitude of the optical power input from the optical power monitor 30, the optical power peak hold unit 53 keeps holding the currently held maximum value of the optical power. Note that to eliminate phenomena such as unintentional light having a high peak value, the optical power monitor 30 may include a low-pass filter and is configured not to detect peaks in the light with a duration of 10 μs or less, for example. Alternatively, in cases where the duration over which the optical power reaches a maximum value is a predetermined time such as 10 μs or less, for example, the optical power peak hold unit 53 may be controlled to treat such values as unintentional light and not handle such values as a maximum value of the optical power.

Next, in a degree-of-deterioration estimating step ST3, the controller 51 controls the degree-of-deterioration estimation unit 54. The degree-of-deterioration estimation unit 54 controlled by the controller 51 refers to the memory 56 to estimate the degree of deterioration of the light source 2 as above from the maximum value of the driving current within the predetermined period held in the driving current peak hold unit 52 and the maximum value of the power of the light within the predetermined period held in the optical power peak hold unit 53. Note that in the case where an output unit is provided as above, the estimated degree of deterioration of the light source 2 is output from the output unit.

Next, in a use-limit time estimating step ST4, the controller 51 controls the use-limit time estimation unit 55. The use-limit time estimation unit 55 controlled by the controller 51 refers to the memory 56 to estimate the time until the light source 2 reaches a predetermined use limit from the degree of deterioration of the light source 2 estimated by the degree-of-deterioration estimation unit 54 as above. Note that in the case where an output unit is provided as above, the estimated time until the use limit of the light source 2 is output from the output unit.

With this arrangement, according to the laser device 1 according to one or more embodiments, the degree of deterioration of the light source 2 and the time until the use limit of the light source 2 are estimated.

The degree of deterioration of the light source 2 and the time until the light source 2 reaches the use limit estimated in this way are not updated within the predetermined period unless the maximum value of the driving current held by the driving current peak hold unit 52 or the maximum value of the power of the light held by the optical power peak hold unit 53 is updated. Also, because the driving current peak hold unit 52 and the optical power peak hold unit 53 are reset every predetermined period as above, after a reset, the maximum value of the driving current is again held in the driving current peak hold unit 52, while in addition, the maximum value of the power of the light is again held in the optical power peak hold unit 53. Consequently, after a reset, the degree of deterioration of the light source 2 and the time until the light source 2 reaches the use limit are estimated.

Next, the operations of the laser device 1 in the case where the power of the light emitted from the light source 2 drops because of deterioration of the light source 2, a method for estimating the degree of deterioration of the light source 2 of the laser device 1, and a method for estimating the use-limit time of the light source 2 will be described.

In the case where the plurality of laser diodes 21 in the pumping light source unit 20 of the light source 2 become deteriorated, the power of the light emitted from the light source 2 drops. Subsequently, a signal indicating the drop in the power of the light is input into the processor 50 from the optical power monitor 30. In one or more embodiments, when a signal indicating a drop in the power of the light is input into the processor 50 from the optical power monitor 30, the controller 51 controls the driving power source unit 41 to increase the driving current in a range in which the power of the light emitted from the light source 2 does not exceed the power of the light before the signal indicating the drop in the power of the light was input from the optical power monitor 30.

Figure 5:
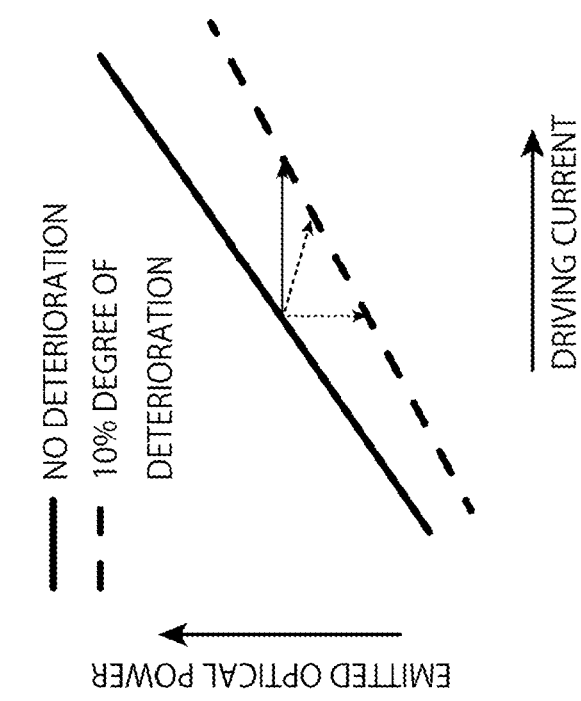
FIG. 5 is a diagram that schematically illustrates a relationship between the magnitude of the driving current, the magnitude of the power of the light, and the degree of deterioration of the light source in a case where a controller controls a driving power source unit to increase the driving current in a case where the light source has deteriorated.

FIG. 5 is a diagram that schematically illustrates a relationship between the magnitude of the driving current, the magnitude of the power of the light, and the degree of deterioration of the light source 2 in a case where the controller 51 controls the driving power source unit 41 to increase the driving current in a case where the light source 2 has deteriorated. Note that FIG. 5 illustrates an example of a case where the light source 2 has deteriorated 10% from a non-deteriorated state. In a state in which the driving power source unit 41 is controlled as above, the driving power source unit 41 increases the value of the current as indicated by the dashed arrow in FIG. 5. In this case, the power of the light emitted from the light source 2 increases compared to the case where the driving current is not increased at all as indicated by the dotted arrow in FIG. 5. However, in the case of the present example, the power of the light emitted from the light source 2 is smaller compared to the state before the light source 2 became deteriorated, that is, before the signal indicating a drop in the power of the light was input into the processor from the optical power monitor 30. Consequently, the maximum value of the driving current held in the driving current peak hold unit 52 is updated, but the maximum value of the power of the light held in the optical power peak hold unit 53 remains the same as before the signal indicating a drop in the power of the light was input from the optical power monitor 30. However, because the maximum value of the driving current held in the driving current peak hold unit 52 is updated, compared to the case where the driving current is not increased at all as indicated by the dotted arrow in FIG. 5, the degree-of-deterioration estimation unit 54 can appropriately estimate the degree of deterioration of the light source 2 in the degree-of-deterioration estimating step ST3, and the use-limit time estimation unit 55 can accurately estimate the time until the light source 2 reaches the use limit in the use-limit time estimating step ST4.

Also, in the case where the plurality of laser diodes 21 in the pumping light source unit 20 of the light source 2 become deteriorated, and a signal indicating a drop in the power of the light is input into the processor 50 from the optical power monitor 30, the driving power source unit 41 may be controlled such that the power of the light emitted from the light source 2 becomes the same as the power of the light before the signal indicating a drop in the power of the light was input from the optical power monitor 30. In other words, by increasing the current output from the driving power source unit 41 when a signal indicating a drop in the power of the light is input into the processor 50, the controller 51 performs a feedback control causing the state of reduced power of the light emitted from the light source 2 to be temporary. In this case, the driving power source unit 41 increases the value of the current as indicated by the solid arrow in FIG. 5. By controlling the current in this way, the maximum value of the power of the light held in the optical power peak hold unit 53 does not change, but the maximum value of the driving current held in the driving current peak hold unit 52 is updated. Consequently, in the degree-of-deterioration estimating step ST3, the degree-of-deterioration estimation unit 54 can estimate the degree of deterioration of the light source 2 more appropriately. For this reason, in the use-limit time estimating step ST4, the use-limit time estimation unit 55 can estimate the time until the light source 2 reaches the use limit more accurately.

As described above, the laser device 1 according to one or more embodiments includes a light source 2 including a plurality of laser diodes 21; a driving current peak hold unit 52 that holds a maximum value within a predetermined period of a driving current applied to the plurality of laser diodes 21; an optical power peak hold unit 53 that holds a maximum value within the predetermined period of a power of light emitted from the light source 2; memory 56 that stores a relationship between a magnitude of the driving current, a magnitude of the power of the light, and a degree of deterioration of the light source 2; and a degree-of-deterioration estimation unit 54 that refers to the memory 56 to estimate the degree of deterioration from the maximum value within the predetermined period of the driving current held in the driving current peak hold unit 52 and the maximum value within the predetermined period of the power of the light held in the optical power peak hold unit 53.

Further, a method for estimating the degree of deterioration of the light source 2 of the laser device 1 according to one or more embodiments includes a driving current peak holding step ST1 that holds a maximum value within a predetermined period of a driving current applied to the plurality of laser diodes 21; an optical power peak holding step ST2 that holds a maximum value within the predetermined period of a power of light emitted from the light source 2; and a degree-of-deterioration estimating step ST3 that refers to the memory 56 that stores a relationship between a magnitude of the driving current, a magnitude of the power of the light, and a degree of deterioration of the light source 2 to estimate the degree of deterioration from the maximum value within the predetermined period of the driving current held in the driving current peak holding step ST1 and the maximum value within the predetermined period of the power of the light held in the optical power peak holding step ST2.

According to such a laser device 1 according to one or more embodiments and such a method for estimating the degree of deterioration of the light source 2 of the laser device 1, even in cases where the timing when the magnitude of the driving current applied to the laser diodes reaches a maximum does not match the timing when the power of the light emitted from the light source including the plurality of laser diodes becomes a maximum, the state of deterioration of the light source can be estimated appropriately by estimating the degree of deterioration of the light source from the maximum value of the driving current and the maximum value of the power of the light within a predetermined period.

Also, in the laser device 1 according to one or more embodiments, the memory 56 additionally stores the relationship between the degree of deterioration and the time until the light source 2 reaches a predetermined use limit, and the laser device 1 is additionally provided with the use-limit time estimation unit 55 that refers to the memory 56 to additionally estimate the time until the use limit from the estimated degree of deterioration. Also, the method for estimating the degree of deterioration of the light source 2 of the laser device 1 according to one or more embodiments additionally includes a use-limit time estimating step ST4 that additionally estimates the time until the light source 2 reaches a predetermined use limit from the estimated degree of deterioration.

Even when the state of deterioration of the light source 2 is estimated appropriately, it is still difficult for a user to grasp the amount of time left until the use limit of the laser device 1 is reached on the basis of the estimated degree of deterioration. However, in one or more embodiments, by estimating the time until a use limit from the degree of deterioration of the light source 2, the user of the laser device 1 can easily grasp the amount of time left until the use limit, and make appropriate preparations, such as readying a spare light source, in a timely manner.

Next, one or more embodiments of the present invention will be described in detail and with reference to FIG. 6. Note that, unless specifically described otherwise, structural elements which are the same or substantially the same as the embodiments described above will be denoted with the same reference signs, and duplicate description will be omitted.

Figure 6:
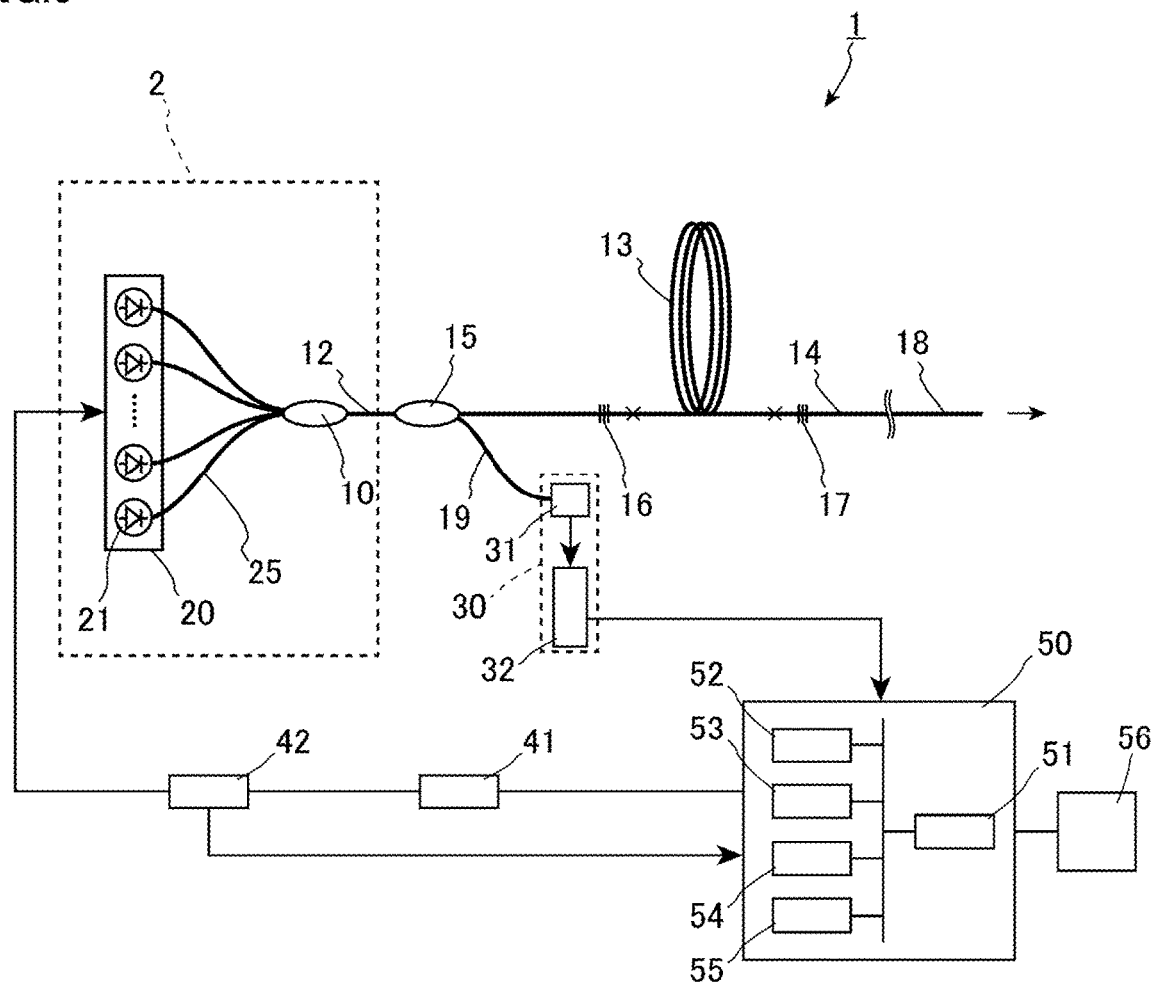
FIG. 6 is a diagram illustrating a laser device according to one or more embodiments of the present invention.

FIG. 6 is a diagram illustrating a laser device 1 according to one or more embodiments. As illustrated in FIG. 6, in the laser device 1 according to one or more embodiments, the amplification optical fiber 13 is disposed on the outside of the light source 2, and the light source 2 has a configuration similar to the pumping light source unit 20 of one more embodiments described above.

The laser diodes 21 of the light source 2 are respectively connected to the pumping optical fiber 25, similarly to the pumping light source unit 20 of one or more embodiments described above. Each pumping optical fiber 25 is connected in the combiner 10 to the optical fiber 12 in which the high-reflectivity FBG 16 is formed. The end of the optical fiber 12 on the opposite side from the combiner 10 is connected to the amplification optical fiber 13. The end of the amplification optical fiber 13 on the opposite side from the optical fiber 12 is connected to the optical fiber 14 in which the low-reflectivity FBG 17 is formed. The side of the optical fiber 14 opposite from the amplification optical fiber 13 is connected to the delivery fiber, that is, the optical fiber 18.

In one or more embodiments, the coupler 15 is provided on the optical fiber 12 between the combiner 10 and the high-reflectivity FBG 16. The majority of the light propagated through the optical fiber 12 continues to be propagated through the optical fiber 12 in the coupler 15, while a fixed ratio of the light propagated through the optical fiber 12 is split at the coupler 15 and directed into the optical fiber 19.

The laser device 1 according to one or more embodiments forms a fiber laser device including the light source 2 and the amplification optical fiber 13. In other words, in the laser device 1 according one or more embodiments described above, the power of the light emitted from the amplification optical fiber 13 is monitored by the optical power monitor 30, whereas in the laser device 1 according to one or more embodiments described below, the optical power monitor 30 monitors the power of the light before the light enters the amplification optical fiber 13, and the optical power peak hold unit 53 holds the maximum value within the predetermined period of the power of the light before the light enters the amplification optical fiber 13. For this reason, the relationship between the magnitude of the driving current, the magnitude of the power of the light, and the degree of deterioration of the light source 2 stored in the memory 56 referenced by the degree-of-deterioration estimation unit 54 is different from the relationship between the magnitude of the driving current, the magnitude of the power of the light, and the degree of deterioration of the light source 2 stored in the memory 56 in one or more embodiments described above. Note that likewise in one or more embodiments, the power of the light propagated through the optical fiber 12 may also be monitored with a Rayleigh monitor that monitors the Rayleigh light propagated through the optical fiber 12 without using the coupler 15.

In such a laser device 1 according to one or more embodiments, the degree of deterioration of the light source 2 and the time until the light source 2 reaches the use limit may be estimated in a similar manner as the method for estimating the degree of deterioration of the light source 2 and the method for estimating the use-limit time of the light source 2 in the laser device 1 according to one or more embodiments described above.

According to the laser device 1 according to one or more embodiments, the degree of deterioration and the use-limit time of the light source 2 acting as a pumping light source unit can be estimated.

Next, one or more embodiments of the present invention will be described in detail and with reference to FIG. 7. Note that, unless specifically described otherwise, structural elements which are the same or substantially the same as those in one or more embodiments described above will be denoted with the same reference signs, and duplicate description will be omitted.

Figure 7:
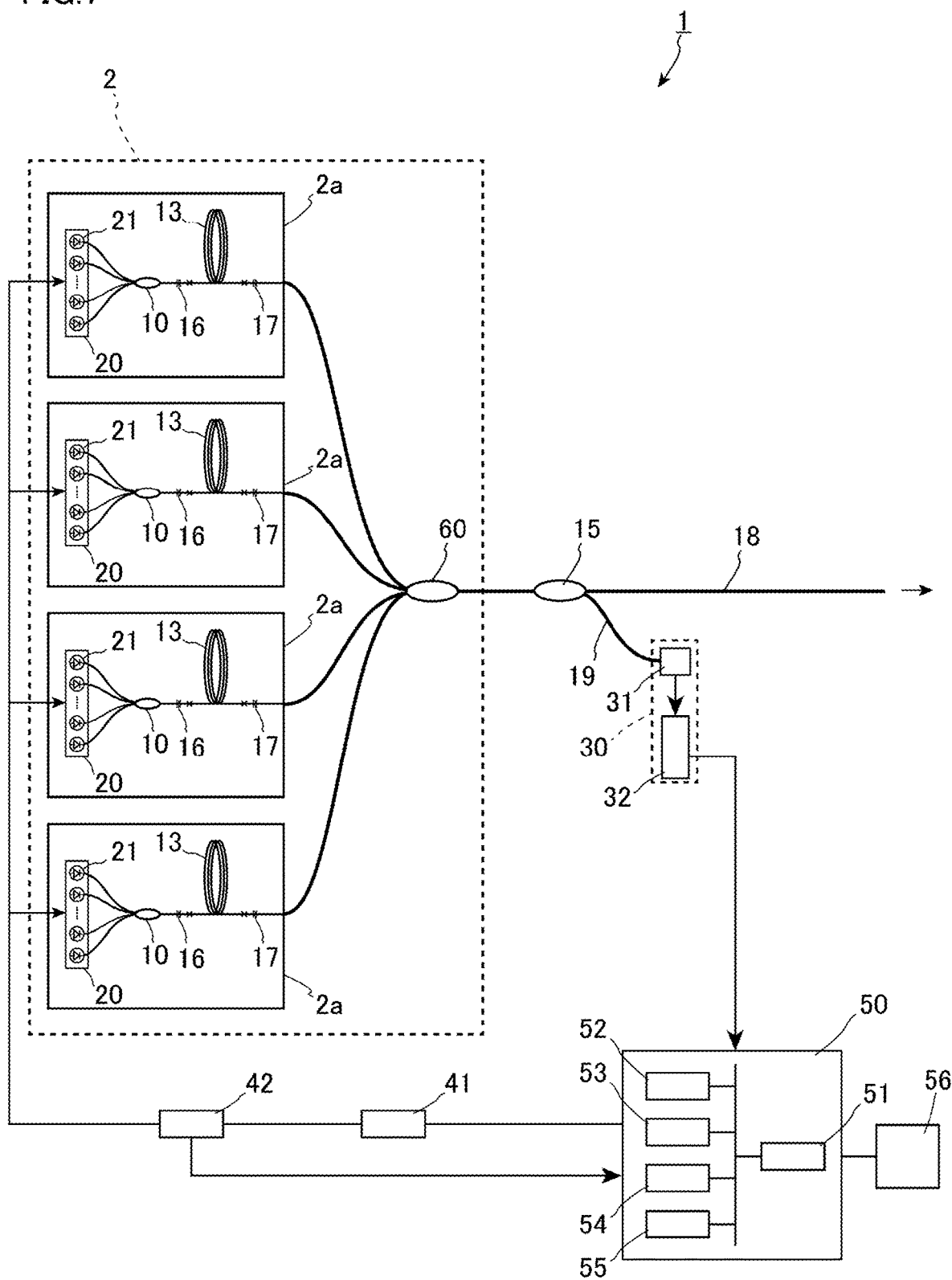
FIG. 7 is a diagram illustrating a laser device according to one or more embodiments of the present invention.

FIG. 7 is a diagram illustrating the laser device 1 according to one or more embodiments. As illustrated in FIG. 7, in the laser device 1 according to one or more embodiments, the light source 2 is provided with a plurality of laser units 2a. Each laser unit 2a has a configuration similar to the light source 2 of one or more embodiments described above. In other words, the light source 2 in the laser device 1 according to one or more embodiments is configured to include a plurality of the light source 2. However, in each laser unit 2a according to one or more embodiments, it is sufficient for the pumping light source unit 20 to include one or more laser diodes 21. Each optical fiber 14 that emits the light from each light source 2 is connected to the delivery fiber, namely the optical fiber 18, in a combiner 60.

In one or more embodiments, the coupler 15 is provided in the middle of the optical fiber 18. Therefore, the majority of the light propagated through the optical fiber 18 continues to be propagated through the optical fiber 18 in the coupler 15, while a fixed ratio of the light propagated through the optical fiber 18 is split at the coupler 15 and directed into the optical fiber 19.

As above, because each laser unit 2a has a configuration similar to the light source 2 according to one or more embodiments described above, the laser device 1 according to one or more embodiments described above can be understood as monitoring the power of the light emitted from a single laser unit with the optical power monitor 30, whereas in the laser device 1 according to one or more embodiments described below, the power of the light emitted from a plurality of laser units 2a is monitored with the optical power monitor 30. However, the laser device 1 according to one or more embodiments described above and the laser device 1 according to one or more embodiments described below are similar in that the power of the light emitted from the light source 2 including the plurality of laser diodes 21 is monitored with the optical power monitor 30. Note that likewise in one or more embodiments, the power of the light propagated through the optical fiber 18 may also be monitored with a Rayleigh monitor that monitors the Rayleigh light propagated through the optical fiber 18 without using the coupler 15. The optical power peak hold unit 53 holds the maximum value within the predetermined period of the power of the light emitted from the plurality of laser units 2a. For this reason, the relationship between the magnitude of the driving current, the magnitude of the power of the light, and the degree of deterioration of the light source 2 stored in the memory 56 referenced by the degree-of-deterioration estimation unit 54 is different from the relationship between the magnitude of the driving current, the magnitude of the power of the light, and the degree of deterioration of the light source 2 stored in the memory 56.

Even in the case where the light source 2 includes a plurality of laser units 2a in this way, the degree of deterioration of the light source 2 and the time until the light source 2 reaches the predetermined use limit may be estimated in a similar manner as the method for estimating the degree of deterioration of the light source 2 and the method for estimating the use-limit time of the light source 2 in the laser device 1 of one or more embodiments described above.

The above describes the present invention by taking the foregoing embodiments as examples, but the present invention is not limited to these examples, and appropriate modifications are possible.

For example, in one or more embodiments, the amplification optical fiber 13, the high-reflectivity FBG 16, and the low-reflectivity FBG 17 are not strictly necessary. In the case where these components are omitted, the laser device 1 according to one or more embodiments has substantially the same configuration throughout the one or more embodiments. Also, each laser unit 2a according to one or more embodiments may have a configuration similar to the light source 2 according to one or more embodiments.

Also, in the foregoing embodiments, even in cases where the amplification optical fiber 13 is used, the high-reflectivity FBG 16 and the low-reflectivity FBG 17 are not strictly necessary. For example, the light source 2, the laser device 1, or each laser unit 2a may also be configured as a master oscillator-power amplifier (MO-PA) fiber laser device including a different type of light source unit than a pumping light source unit.

Also, in the foregoing embodiments, the laser device 1 includes the driving current monitor 42, and the driving current peak hold unit 52 holds the maximum value of the current value of the driving current input from the driving current monitor 42 according to a signal from the driving current monitor 42. However, the driving current monitor 42 is not strictly necessary, and the driving current peak hold unit 52 may also hold the maximum value of the driving current on the basis of a signal by which the controller 51 controls the driving power source unit 41, for example.

According to the present invention, a laser device capable of appropriately estimating a state of deterioration of a light source using laser diodes and a method for estimating the degree of deterioration of a light source of a laser device are provided. The present invention is usable in a variety of industries such as the laser processing field and the medical field.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 Laser device
2 Light source
2a Laser unit
13 Amplification optical fiber
16 High-reflectivity FBG
17 Low-reflectivity FBG 20 Pumping light source unit
21 Laser diode
30 Optical power monitor
41 Driving power source unit
42 Driving current monitor
50 Processor
51 Controller
52 Driving current peak hold unit
53 Optical power peak hold unit
54 Degree-of-deterioration estimation unit
55 Use-limit time estimation unit
56 Memory
ST1 Driving current peak holding step
ST2 Optical power peak holding step
ST3 Degree-of-deterioration estimating step
ST4 Use-limit time estimating step

The invention claimed is:

1. A laser device comprising:
a light source comprising laser diodes;
a processor that holds:
  a maximum current value within a predetermined period of a driving current applied to the laser diodes, and
  a maximum power value within a predetermined period of a power of light emitted from the light source; and
a memory, coupled to the processor, that stores a relationship between a magnitude of the driving current, a magnitude of the power of the light, and a degree of deterioration of the light source, wherein
the processor further refers to the memory and estimates the degree of deterioration from the maximum current value and the maximum power value.

2. The laser device according to claim 1, wherein
the memory further stores a relationship between the degree of deterioration and a time until the light source reaches a predetermined use limit, and
the processor further: refers to the memory and estimates the time until the light source reaches the predetermined use limit from the estimated degree of deterioration.

3. The laser device according to claim 1, further comprising:
a driving power source that applies a current to the laser diodes; and
an optical power monitor that monitors the power of the light emitted from the light source, wherein
when a signal indicating a drop in the power of the light is input from the optical power monitor to the processor, the processor further controls the driving power source to increase the driving current in a range in which the power of the light emitted from the light source does not exceed the power of the light before the input of the signal indicating the drop.

4. The laser device according to claim 1, further comprising:
a driving power source that applies a current to the laser diodes; and
an optical power monitor that monitors the power of the light emitted from the light source, wherein
when a signal indicating a drop in the power of the light is input from the optical power monitor to the processor, the processor further controls the driving power source to make the power of the light emitted from the light source equal to the power of the light before the input of the signal-indicating the drop.

5. The laser device according to claim 1, wherein the processor further:
erases the held maximum current value after the predetermined period elapses, and
erases the held maximum power value after the predetermined period elapses.

6. The laser device according to claim 1, wherein
the light source further comprises an amplification optical fiber doped with an active element that is pumped by light emitted from the laser diodes.

7. The laser device according to claim 1, further comprising:
an amplification optical fiber doped with an active element that is pumped by light emitted from the light source, wherein
the processor further holds, within the memory, the maximum power value before the light enters the amplification optical fiber.

8. A method for estimating a degree of deterioration of a light source of a laser device where the light source comprises laser diodes, the method comprising:
holding a maximum current value within a predetermined period of a driving current applied to the plurality of laser diodes;
holding a maximum power value within the predetermined period of a power of light emitted from the light source;
referring to a memory that stores a relationship between a magnitude of the driving current, a magnitude of the power of the light, and the degree of deterioration of the light source; and
estimating the degree of deterioration from the maximum current value and the maximum power value.

9. The method according to claim 8, wherein
the memory further stores a relationship between the degree of deterioration and a time until the light source reaches a predetermined use limit, and
the method further comprising:
  estimating the time until the light source reaches the predetermined use limit from the estimated degree of deterioration.

* * * * *